United States Patent
Sakamoto et al.

(10) Patent No.: US 7,649,923 B2
(45) Date of Patent: Jan. 19, 2010

(54) METHOD FOR MANUFACTURING NITRIDE SEMICONDUCTOR LASER ELEMENT, AND NITRIDE SEMICONDUCTOR LASER ELEMENT

(75) Inventors: Keiji Sakamoto, Tokushima (JP); Mitsuhiro Nonaka, Tokushima (JP)

(73) Assignee: Nichia Corporation, Anan-shi (JP)

( * ) Notice: Subject to any disclaimer, the term of this patent is extended or adjusted under 35 U.S.C. 154(b) by 187 days.

(21) Appl. No.: 11/797,291

(22) Filed: May 2, 2007

(65) Prior Publication Data

US 2007/0264802 A1    Nov. 15, 2007

(30) Foreign Application Priority Data

May 11, 2006  (JP)  ............... 2006-132477
Apr. 24, 2007  (JP)  ............... 2007-113635

(51) Int. Cl.
*H01S 5/00* (2006.01)
*H01S 3/20* (2006.01)

(52) U.S. Cl. ........................................ 372/54; 372/50.1
(58) Field of Classification Search .................. 372/54, 372/50.1

See application file for complete search history.

(56) References Cited

U.S. PATENT DOCUMENTS 7,103,082 B2 *  9/2006  Sugimoto et al. ........... 372/50.1
2008/0191226 A1 *  8/2008  Urashima .................... 257/98

FOREIGN PATENT DOCUMENTS

| JP | 2000-164964 A | 6/2000 |
|----|---------------|--------|
| JP | 2002-261370 A | 9/2002 |
| JP | 2003-046177 A | 2/2003 |
| JP | 2003-332244 A | 11/2003 |
| JP | 2004-158500 A | 6/2004 |
| JP | 2005-175056 A | 6/2005 |

* cited by examiner

*Primary Examiner*—Armando Rodriguez
(74) *Attorney, Agent, or Firm*—Global IP Counselors, LLP

(57) ABSTRACT

A method for manufacturing a nitride semiconductor laser element, equipped with a laminate that has a first conductivity type nitride semiconductor layer, an active layer, and a second conductivity type nitride semiconductor layer on a substrate, and constitutes a resonator, comprises the steps of: forming a first auxiliary groove having an exposed region extending in the resonator direction of the laser element and in which at least the second conductivity type nitride semiconductor layer and the active layer are removed from the second conductivity type nitride semiconductor layer side on both sides in the resonator direction of an element region where the laser element is formed on the surface of the laminate, thereby exposing the first conductivity type nitride semiconductor layer, and two protrusion regions that are narrower than the exposed region and protrude in the resonator direction from the exposed region; forming a second auxiliary groove whose angle of inclination of the side faces with respect to the normal direction versus the substrate surface is greater than that of the first auxiliary groove within the exposed region; and dividing the substrate and the laminate with using the second auxiliary groove.

21 Claims, 7 Drawing Sheets

METHOD FOR MANUFACTURING NITRIDE SEMICONDUCTOR LASER ELEMENT, AND NITRIDE SEMICONDUCTOR LASER ELEMENT

BACKGROUND OF THE INVENTION

1. Field of the Invention

The present invention relates to a method for manufacturing nitride semiconductor laser element, and nitride semiconductor laser element, and more particularly relates to a method for manufacturing nitride semiconductor laser element which allows making in chip form at good reproducibility, and a nitride semiconductor laser element formed by the method.

2. Background Information

A nitride semiconductor is formed by a compound semiconductor of $In_xAl_yGa_{1-x-y}N$ ($0 \leq x$, $0 \leq y$, $0 \leq x+y \leq 1$), and semiconductor laser elements in which this is used are subject to an increasing variety of requirements, such as use in a next-generation DVD or another such optical disk system that has a large capacity and allows the recording and reproduction of information at high density, or use in personal computers and other such electronic devices. Accordingly, a great deal of research has gone into a way to manufacture semiconductor laser elements from nitride semiconductors efficiently while maintaining stable characteristics.

For example, a method that has been employed to laminate a nitride semiconductor layer on a wafer and then divide the resulting wafer laterally and longitudinally to form individual chips involves first using etching or cleaving to divide the wafer into bar-shaped pieces so as to form resonator faces of a plurality of laser elements, form a dielectric film as needed on the resonator faces, and then divide the bar-shaped wafers in a direction perpendicular to the resonator face by dicing, scribing, or the like (see, for example, Japanese Laid-Open Patent Application 2000-164964). Another method involves performing the dividing for forming the resonator faces and the subsequent dividing in a direction perpendicular to the resonator face in the opposite order (see, for example, Japanese Laid-Open Patent Application 2002-261370). Moreover, using a laser as a method for scribing has been proposed (see, for example, Japanese Laid-Open Patent Application 2003-46177).

However, when a wafer is cut by one of the above methods, for example, a problem is encountered in that chipping occurs around the cuts.

Also, with a method involving scribing with a scriber or a laser, since breakage is accomplished by applying pressure to scratches made in the wafer surface, the break may occur in an unintended direction depending on the crystal system and so forth of the wafer or laminate, resulting in more chip damage.

Furthermore, with these methods, depending on how the dividing is done, there may be some uneven bumpiness, particularly around the edges of a chip, and this can cause problems in subsequent handling.

Also, burrs, shavings, and the like may adhere to the divided portions, which can lower the yield of laser elements and adversely affect the performance of the laser elements themselves.

SUMMARY OF THE INVENTION

The present invention was conceived in light of this situation, and provides a method for manufacturing a nitride semiconductor laser element with which occurring chipping around the cut and breaking chip can be efficiently prevented, burrs and shavings are prevented from adhering to the divided portions, the subsequent processing of handling the laser elements can be carried out smoothly, and laser elements of consistent quality can be efficiently manufactured, and to a nitride semiconductor laser element manufactured by this method.

The present invention provides a method for manufacturing a nitride semiconductor laser element, equipped with a laminate that has a first conductivity type nitride semiconductor layer, an active layer, and a second conductivity type nitride semiconductor layer on a substrate, and constitutes a resonator, comprising the steps of:

forming a first auxiliary groove having an exposed region extending in the resonator direction of the laser element and in which at least the second conductivity type nitride semiconductor layer and the active layer are removed from the second conductivity type nitride semiconductor layer side on both sides in the resonator direction of an element region where the laser element is formed on the surface of the laminate, thereby exposing the first conductivity type nitride semiconductor layer, and two protrusion regions that are narrower than the exposed region and protrude in the resonator direction from the exposed region;

forming a second auxiliary groove whose angle of inclination of the side faces with respect to the normal direction versus the substrate surface is greater than that of the first auxiliary groove within the exposed region; and dividing the substrate and the laminate with using the second auxiliary groove.

Further, the present invention provides a nitride semiconductor laser element equipped with a laminate that has a first conductivity type nitride semiconductor layer, an active layer, and a second conductivity type nitride semiconductor layer on a substrate and constitutes a resonator, wherein the laminate has an edge that slopes to the inside of the laser element with respect to a side face of the laminate extending in the resonator direction. Moreover, the present invention provides a nitride semiconductor laser element equipped with a laminate that has a first conductivity type nitride semiconductor layer, an active layer, and a second conductivity type nitride semiconductor layer on a substrate, and constitutes a resonator, comprising:

on both sides in the resonator direction of an element region where a laser element is formed on the surface of the laminate, a first auxiliary groove having an exposed region extending in the resonator direction of the laser element and in which at least the first conductivity type nitride semiconductor layer is exposed, and two protrusion regions that are narrower than the exposed region and protrude in the resonator direction from the exposed region; and a second auxiliary groove that is disposed in the exposed region and is deeper than the first auxiliary groove.

According to the present invention, occurring chipping around the cut and breaking chip can be prevented, yield of laser elements can be boosted by the method of the present invention for manufacturing a nitride semiconductor laser element.

Also, burrs and shavings are prevented from adhering to the divided portions, so bumpiness of the edges that would adversely affect the subsequent process of handling the laser elements can be machined smooth, therefore, the subsequent processing of handling the laser elements can be carried out smoothly, and laser elements of consistent quality can be efficiently manufactured.

Furthermore, by utilizing laser scribing, the portions to be laser scribed can be recognized and machined in wafer units, so machining takes less time and running costs can be reduced, and since there is no need to replace consumable parts as in a scribing method that entails physical contact, manufacturing cost can be further lowered.

Also, with the nitride semiconductor laser element of the present invention, any uneven bumpiness at the edges of the element can be effectively removed. In addition, it is possible to avoid cracking that would otherwise occur, for example, when the laminate is grasped in a later process due to the adhesion of burrs or shavings, and to avoid problems such as short circuiting caused by the adhesion of shavings, and to provide a laser element of high quality.

The present invention can be utilized in the manufacture of not only laser elements, but also of light emitting diodes (LEDs) and other such light emitting elements, solar cells, photosensors and other such light receiving elements, and transistors and other such semiconductor devices.

DESCRIPTION OF THE PREFERRED EMBODIMENTS

Figure 1:
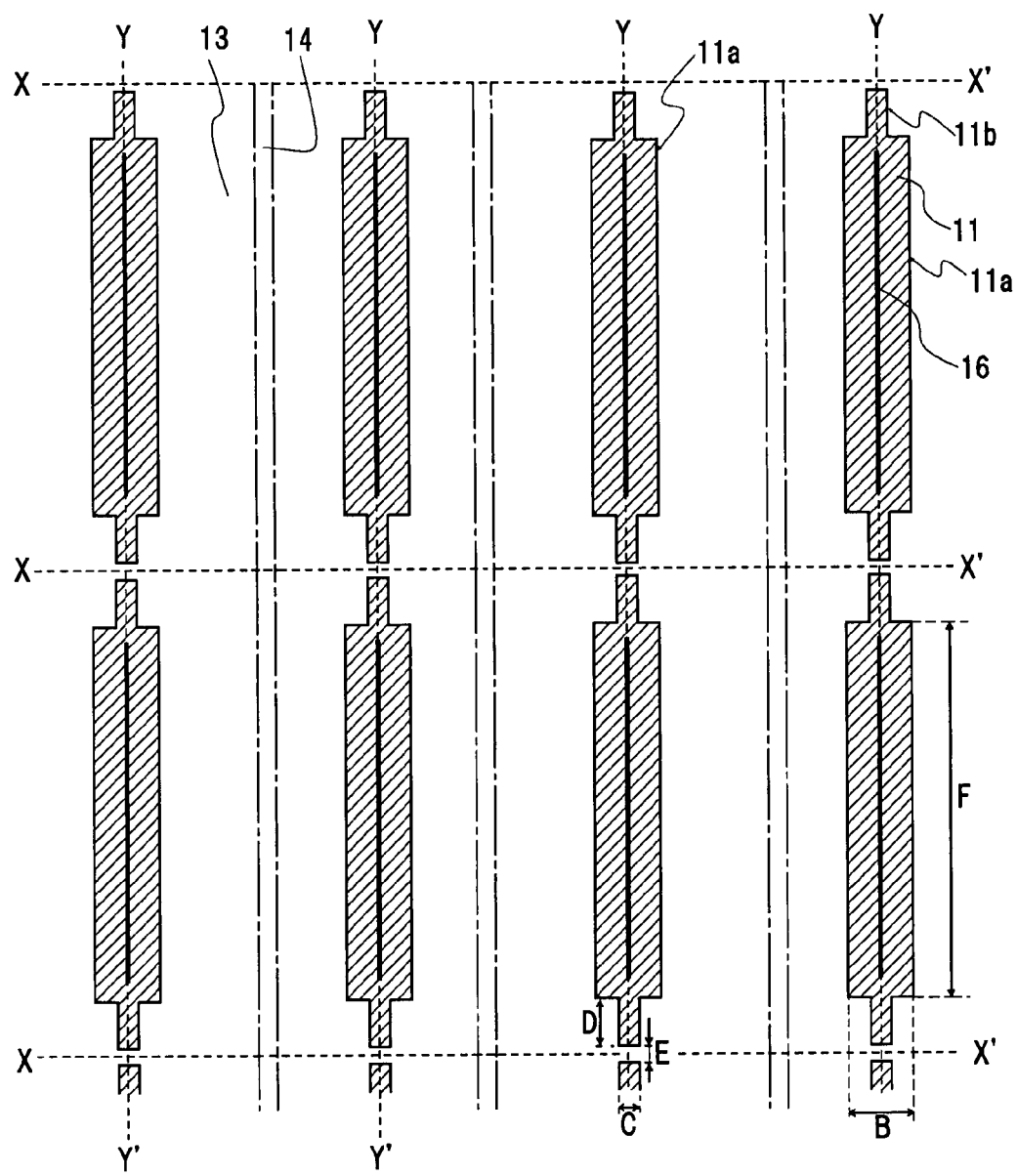
FIGS. 1 and 2 are plan views of the layout of the exposed region and protrusion regions formed by the method of the present invention for manufacturing a nitride semiconductor laser element.

For manufacturing the nitride semiconductor layer of the present invention, first, a laminate is prepared by forming a first conductivity type nitride semiconductor layer, an active layer and a second conductivity type nitride semiconductor layer on a substrate.

Here, the substrate used for the present invention includes insulating substrates, such as sapphire, spinel ($MgAl_2AO_4$) having a main face of C plane, A plane or R plane, or SiC (6H, 4H, 3C), Si, ZnS, ZnO, GaAs, diamond and oxide substrates, such as lithium niobate, neodymium gallte, or the like which are lattice-matched to a nitride semiconductor, but the nitride semiconductor substrates (GaN, AlN, etc.) are preferred. For instance, nitride semiconductor substrates (GaN, AlN, etc.) having an off angle of at least 0.03° and no more than 10° at the first main face and/or the second main face are preferred. The thickness thereof can be about 50 μm to 10 mm, for example. The nitride semiconductor substrate can be formed by a vapor phase growth method such as MOCVD, HVPE, MBE, or the like, a hydrothermal synthesis method in which crystals are grown in a supercritical fluid, a high pressure method, a flux method, a melt method, or the like. A commercially available product may also be used. A buffer layer, intermediate layer (for example, $Al_xGa_{1-x}N$ ($0 \leq x \leq 1$)), or other layer may also be formed on the substrate surface ahead of forming the laminate which functions as a laser element.

The laminate formed on the first main face of the substrate may include the nitride semiconductor layer having a general formula of $In_xAl_yGa_{1-x-y}N$ ($0 \leq x \leq 1$, $0 \leq y \leq 1$, $0 \leq x+y \leq 1$). In addition to this, it may be used the semiconductor layer which is partly substituted with B as a group III element, or is substituted a part of N as a group V element with P or As. The first conductivity type and the second conductivity type mean either n-type or p type. The n-type semiconductor layer may doped with at least one n-type impurity of IV or VI group elements, such as Si, Ge, Sn, S,O, Ti, Zr, Cd etc. and the p-type semiconductor layer may doped with at least one p-type impurity, such as Mg, Zn, Be, Mn, Ca, Sr etc. The doped concentration is, for example, about $5 \times 10^{16}/cm^3$ to about $1 \times 10^{21}/cm^3$. All of layers in the n-type or p-type semiconductor layers may not necessarily contain n-type or p-type impurity.

The laminate may comprise an optical guide layer that constitutes an optical waveguide provided to the n-type semiconductor layer and p-type semiconductor layer, and may preferably be a SCH (Separate Confinement Heterostructure) structure, but the optical guide layer may be provided to either the n-type semiconductor layer or the p-type semiconductor layer. If the optical guide layer is provided to both the n-type semiconductor layer and the p-type semiconductor layer, in which there may be two different compositions and/or two different thicknesses.

The laminate is formed, for example, the n-type semiconductor layer, the active layer and the p-type semiconductor layer in this order. The n-type and p-type semiconductor layers can be formed as a single layer structure, multilayer film structure or superlattice structure of two different composition layers. The laminate may be had a compositional gradient layer and/or concentration gradient layer in these layers. These laminates function so as to amplify and resonate the light generated by the active layer.

It may be for the n-type semiconductor layer to be a formed by a single layer, but favorable to be a multilayer film. For example, the first n-type semiconductor layer is $Al_xGa_{1-x}N$ ($0 \leq x \leq 0.5$), and preferably $Al_xGa_{1-x}N$ ($0 \leq x \leq 0.3$). Specific growth conditions include a growth temperature of at least 1000° C. and a pressure of no more than 600 Torr in a reaction furnace. The first n-type semiconductor layer can also function as a cladding layer. The film thickness is favorably about 0.5 to 5 μm.

The second n-type semiconductor layer can function as an optical guide layer, and can be formed from $Al_xGa_{1-x}N$ ($0 \leq x \leq 0.3$). The film thickness is favorably 0.5 to 5 μm. The n-type semiconductor layer can be formed to three layers with different compositions and different thicknesses to each other.

The active layer may have either a multiple quantum well structure or a single quantum well structure, but preferably has a general formula of $In_xAl_yGa_{1-x-y}N$ ($0 \leq x \leq 1$, $0 \leq y < 1$, $0 < x+y \leq 1$) containing at least indium. Light in the ultraviolet band can be emitted by raising the aluminum content. Light of a longer wavelength can also be emitted, and emission from 360 nm up to 580 nm is possible. Forming the active layer with a quantum well structure improves emission efficiency.

The p-type semiconductor layer is laminated on the active layer. A first p-type semiconductor layer is $Al_xGa_{1-x}N$ ($0 \leq x \leq 0.5$) containing a p-type impurity. The first p-type semiconductor layer functions as a p-side electron confinement layer. The second p-type semiconductor layer can be formed from $Al_xGa_{1-x}N$ ($0 \leqq x \leqq 0.3$), and the third p-type semiconductor layer from $Al_xGa_{1-x}N$ ($0 \leqq x \leqq 0.5$) containing a p-type impurity. The third p-type semiconductor layer preferably is a superlattice structure composed of GaN and AlGaN, and functions as a cladding layer. The fourth p-type semiconductor layer can be formed from $Al_xGa_{1-x}N$ ($0 \leqq x \leqq 1$) containing a p-type impurity. Indium crystals may also be mixed into these semiconductor layers. The first p-type semiconductor layer and the second p-type semiconductor layer can be omitted. The thickness of each layer is favorably about 3 nm to 5 μm. If the thickness of 2000 Å or less, a semiconductor layer may be further formed between the p-type semiconductor layers.

The nitride semiconductor layer can be formed by means of any known method which can grow these nitride semiconductor layers, such as MOVPE (metal-organic vapor phase epitaxy), MOCVD (metal-organic chemical vapor deposition), HVPE (hydride vapor phase epitaxy), MBE (molecular beam epitaxy), and the like. In particular, MOCVD is preferable because it allows the nitride semiconductor to be growth with good crystallinity under a condition of a reduced pressure to atmospheric pressure.

A ridge that functions as a waveguide region is preferably formed on the surface of the laminate, that is, on the surface of the second conductivity type nitride semiconductor layer.

A suitable width for the ridge is about 1.0 to 50.0 μm. If the beam shape is a single mode, then the ridge width is preferably about 1.0 to 3.0 μm. The height of the ridge (the etching depth) can be suitably adjusted depending on the material, thickness, and so forth of the layer constituting the p-type semiconductor layer, but is from 0.1 to 2 μm, for example. The ridge is preferably designed so that its length in the extension direction of the resonator is about 100 to 2000 μm. The ridge need not be all the same width in the extension direction of the resonator, and its side faces may be vertical or may be tapered with an angle of about 60 to 90°.

The ridge can be formed by forming a mask pattern on the nitride semiconductor layer, and using this mask pattern in etching.

The mask pattern can be formed in the desired shape, by photolithography and etching or any other know method, using an oxide film such as $SiO_2$ or a nitride such as SiN, and utilizing an CVD apparatus or any other apparatus. The thickness of the mask pattern is favorably such that the mask pattern remaining on the ridge after the ridge has been formed can be removed by lift-off method in a subsequent step. About 0.1 to 5.0 μm is favorable, for example. RIE, for example, is preferably used for patterning, and it is good to perform this etching by using a chlorine-based gas such as $Cl_2$, $CCl_4$, $SiCl_4$, $BCl_3$ and/or a fluorine-based gas such as $CF_4$, $CHF_3$, $SIF_4$.

After this, the mask pattern is utilized to etch the nitride semiconductor layer and thereby form a ridge. It is good for the etching to be performed using RIE and a chlorine-based gas, for example. There are no particular restrictions on the substrate temperature during etching, but a lower temperature is (such as about 60 to 200° C.) is preferable.

Also, the laser element of the present invention may have a structure in which no ridge is formed, and a current confinement layer is formed. In this case, first a first conductivity type nitride semiconductor layer is formed, and a current confinement layer having a thickness of about 0.01 to 5 μm, and preferably about 300 nm or less, and having a stripe-shaped opening with a width of about 0.3 to 20 μm, and preferably about 0.5 to 3.0 μm, is formed. Next, an active layer with a quantum well structure, for example, is formed on the first conductivity type nitride semiconductor layer exposed by the opening in the current confinement layer. A second conductivity type nitride semiconductor layer is then formed on the active layer. This current confinement layer can be formed, for example, from an insulating material such as $SiO_2$ or $Al_2O_3$ or from an i-type nitride semiconductor layer. Furthermore, the current confinement layer may be formed by forming a first conductivity type nitride semiconductor layer or second conductivity type nitride semiconductor layer, growing a current confinement layer on the surface thereof, forming a stripe-shaped opening in this current confinement layer, and regrowing a nitride semiconductor layer.

It is preferable to form a first protective film on the surface of the second conductivity type nitride semiconductor layer and on both side faces of the ridge at some stage after the formation of the ridge stripe. Examples of the material of the first protective film include $SiO_2$, or oxides of Ti, Zr, V, Nb, Hf, Ta and other such oxides. The first protective film can be formed by any method known in this field; for instance, it can be formed with a single-layer or laminated structure by any of various methods such as CVD, vapor deposition, ECR (electron cyclotron resonance plasma) sputtering, or magnetron sputtering. Films with the same composition but different film qualities may also be formed by changing the manufacturing method or conditions for a single-layer film one or more times. When a first protective film is formed, it is preferable to form the first protective film on a nitride semiconductor layer while the mask pattern used to form the above-mentioned ridge is still in place.

At some stage, a p-electrode may preferably be formed on the surface of the p-type semiconductor layer or on the surface of the ridge. If the p-electrode has a two-layer structure composed of nickel and gold, for example, first a film of nickel is formed in a thickness of about 5 to about 20 nm on the fourth p-type semiconductor layer, and then a film of gold is formed in a thickness of about 50 to about 300 nm. If the p-electrode has a three-layer structure, it may be formed in the order of Ni—Au—Pt or Ni—Au—Pd. The nickel and gold may have the same thickness as in a two-layer structure, and the platinum or palladium that serves as the final layer is favorably from about 50 to about 500 nm.

Optionally, a pad electrode may be formed on the p-electrode. This pad electrode is preferably a laminate composed of nickel, titanium, gold, platinum, palladium, tungsten, or another such metal. More specifically, the pad electrode may be formed by forming W—Pd—Au or Ni—Ti—Au in that order, starting from the p-electrode side. There are no particular restrictions on the thickness of the pad electrode, but the thickness of the gold film that serves as the final layer is preferably at least 100 nm.

At some stage, it is preferable to perform ohmic annealing after the p-electrode has been formed. Suitable annealing conditions include, for example, a temperature of at least 300° C., and preferably at least 500° C., in an atmosphere containing nitrogen and/or oxygen.

Also, at some stage, a second protective film may be formed on the first protective film after the first protective film has been formed. The second protective film can be formed by any method known in this field. The material of the second protective film may be selected from that of the first protective film.

At some stage, an n-electrode may be formed over all or part of the second main face of the substrate, for example, before of after the p-electrode is formed. The n-electrode can be formed, for example, by sputtering, CVD, vapor deposition, or another such method. The lift-off method is preferably used to form the n-electrode, and annealing is preferably performed at 300° C. or higher after the n-electrode has been formed. The n-electrode may be formed with a total thickness of 1 μm or less, and of vanadium (about 100 Å thick), platinum (about 2000 Å thick), and gold (about 3000 Å thick), Ti(100 Å)-Al(5000 Å), Ti(60 Å)-Pt(1000 Å)-Au(3000 Å), Ti(60 Å)-Mo(500 Å)-Pt(1000 Å)-Au(2100 Å), Ti(60 Å)-Hf (60 Å)-Pt(1000 Å)-Au(3000 Å), Ti(60 Å)-Mo(500 Å)-Ti(500 Å)-Pt(1000 Å)-Au(2100 Å), W—Pt—Au, W—Al—W—Au, starting from the substrate side, or Hf—Al, Ti—W—Pt—Au, Ti—Pd—Pt—Au, Pd—Pt—Au, Ti—W—Ti—Pt—Au, Mo—Pt—Au, Mo—Ti—Pt—Au, W—Pt—Au, V—Pt—Au, V—Mo—Pt—Au, V—W—Pt—Au, Cr—Pt—Au, Cr—Mo—Pt—Au, Cr—W—Pt—Au, starting from the nitride semiconductor side. The n-electrode is preferably formed by applying a pattern over a range excluding, for example, over the laser scribed groove (discussed below) and/or the scribing region or cleavage line for forming the resonator end face (discussed below).

A metallized electrode may also be formed on the n-electrode. This metallized electrode may be formed from, for example, Ti—Pt—Au—(Au/Sn), Ti—Pt—Au—(Au/Si), Ti—Pt—Au—(Au/Ge), Ti—Pt—Au—In, Au—Sn, In, Au—Si, Au—Ge, or the like. There are no particular restrictions on the thickness of the metallized electrode.

The first auxiliary groove is then formed. The first auxiliary groove consists of an exposed region and two protrusion regions. The first auxiliary groove may be formed not only after the formation of the electrode, but also before the formation of the electrode. For instance, the first auxiliary groove may be formed at the same time as the formation of exposed region 11a of the first conductivity type nitride semiconductor layer.

The exposed region and the protrusion regions can be formed by removing at least the second conductivity type nitride semiconductor layer, the active layer, and, optionally, the first conductivity type nitride semiconductor layer from both sides of the element region where the laser element is formed on the laminate surface, that is, the regions on both sides that are adjacent and substantially parallel to the resonator direction, from the second conductivity type nitride semiconductor layer side. The removal of these layers can be accomplished, just as in the formation of the ridge, by forming the desired mask pattern, and using this as a mask to etch in the thickness direction of the laminate.

In the exposed region and the protrusion regions, the first conductivity type nitride semiconductor layer is exposed, and usually the depth of these regions is substantially the same. The exposed region is the same as the element region in that it is disposed extending in the resonator direction, and there are no particular restrictions on its shape, but since the planar shape of the laser element is generally square, parallelogram-shaped, oblong, rectangular, or a shape similar to these, the planar shape of the exposed region is also preferably the similar shape as that of the laser element. For instance, as shown in FIG. 1, when the element region of the laser element (normally the region divided by the X and Y lines) has a substantially oblong planar shape in the planar view, it is good for the exposed region 11a also to be substantially oblong. There are no particular restrictions on the width B of the exposed region 11a, but specific examples include a width of from 1 to 200 μm, and preferably about 2 to 100 μm. The length F can be suitably determined according to the resonator length.

Figure 2:
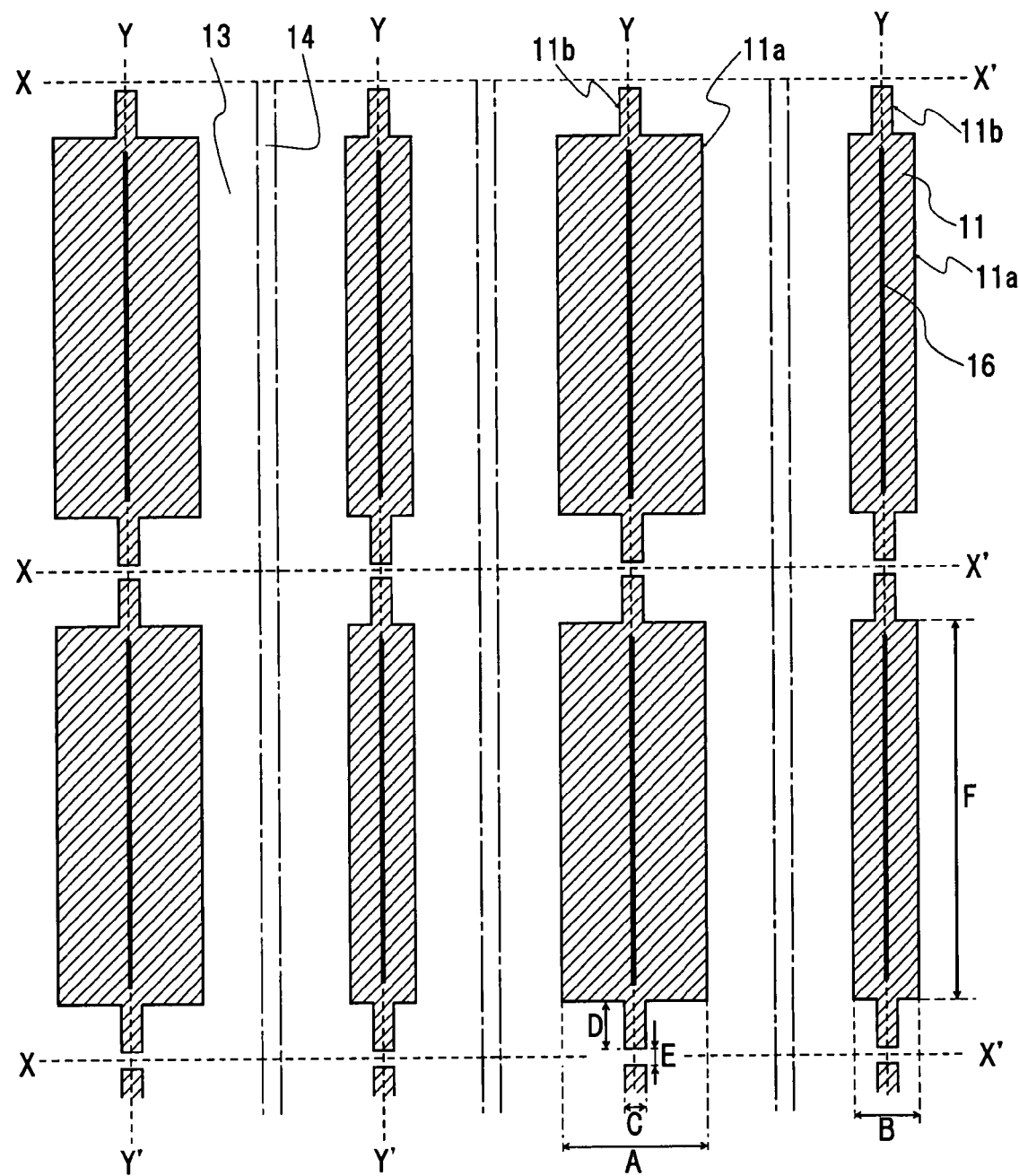

If a plurality of element regions is formed on the substrate, and if, for example, these are formed in a matrix or in a direction perpendicular to the resonator direction, there will also be a plurality of exposed regions 11a. In this case, as shown in FIG. 2, the widths A and B of the exposed regions 11a may differ from one another. There are no particular restrictions on the width A of the exposed region 11a, but specific examples include a width of from 1 to 500 μm, and preferably about 2 to 300 μm.

Figure 7:
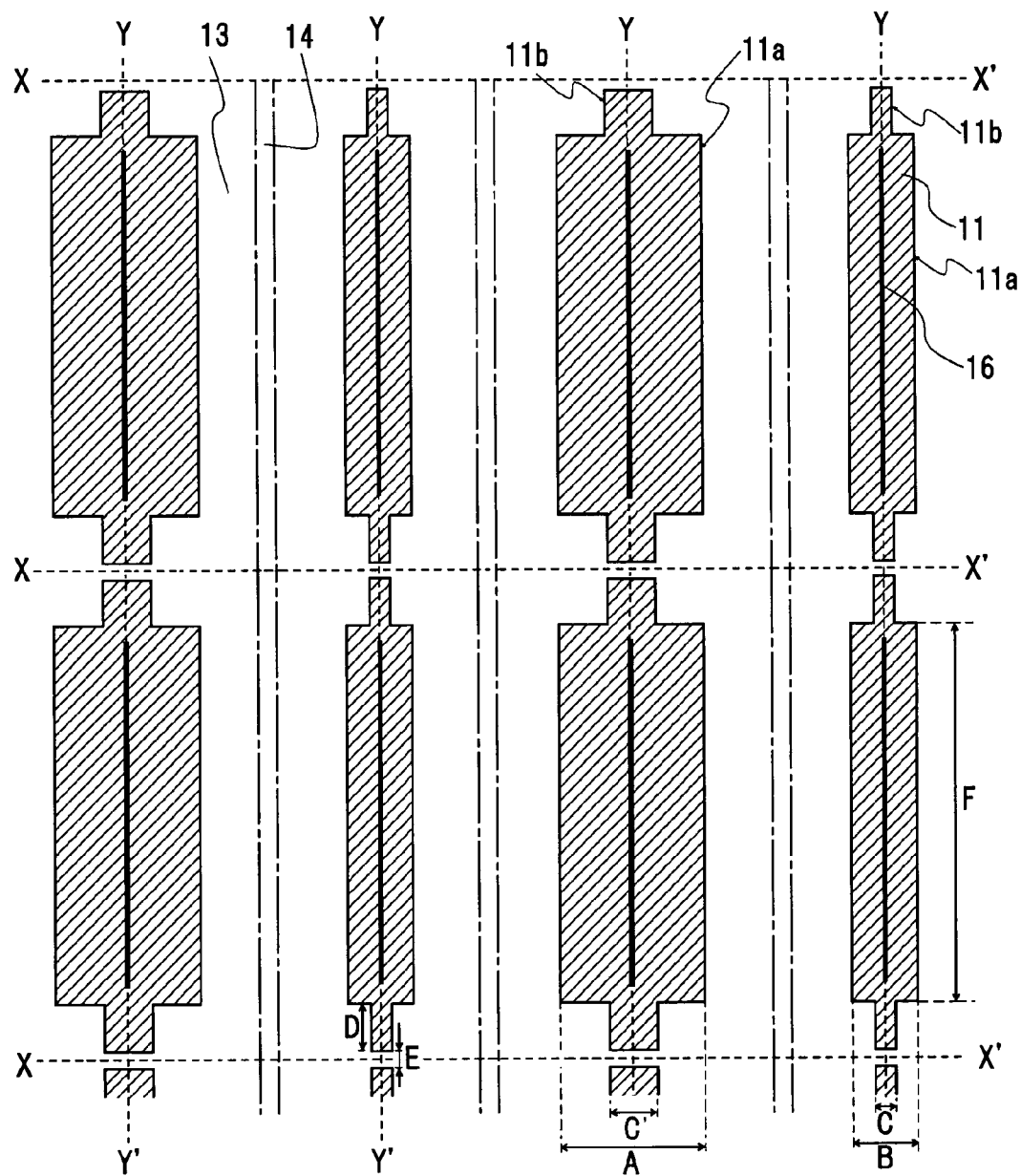
FIG. 7 is a plan view of the layout of the exposed region and protrusion regions formed by the method of the present invention for manufacturing a nitride semiconductor laser element.

Thus varying the width of the exposed regions 11a is particularly effective when a specific type of nitride semiconductor substrate is being used. For instance, as discussed in Japanese Laid-Open Patent Applications 2005-175056, 2004-158500, 2003-332244, and elsewhere, there are substrates on whose surface regions with different numbers of dislocations are disposed in an alternating stripe pattern, substrates in which regions of different crystal defect densities, crystal directions or the like are disposed in a striped pattern by forming semiconductor layer by lateral growth on a substrate and using this semiconductor layer as a substrate, and so forth. The substrate may also be one in which there are regions of different polarity. An example of this is when a first region constituted by the (0001) plane and second region constituted by the (000-1) plane are formed in an alternating stripe pattern. When a substrate such as this is used, it is preferable if the widths (A and B) of the exposed regions are varied alternately as shown in FIG. 2 or FIG. 7, for example, by suitably adjusting the widths of the exposed regions 11a so that good laser characteristics will be achieved for a laminate made up of a nitride semiconductor layer formed on a substrate, according to the disposition of the first region and/or the second region and so forth, that is, to the difference in dislocation density, crystal defect density, impurity concentration, bumpiness, crystal plane, and so on.

As shown in FIGS. 1 and 2 as well as 7, the first auxiliary groove has two protrusion regions 11b that are narrower than the exposed region 11a and protrude in the resonator direction from the exposed region 11a. The shape of the protrusion regions 11b themselves is favorably square, parallelogram-shaped, oblong, rectangular, or a shape similar to these, just as with the exposed region 11a. For instance, as shown in FIGS. 1 and 2 as well as 7, when the laser element has a substantially oblong planar shape, it is good for the protrusion regions 11b also to be substantially oblong as they protrude from the middle portion of the exposed region 11a. There are no particular restrictions on the width C of the protrusion regions 11b, but a specific example is about 0.5 to 20 μm. Also, as shown in FIG. 7, the width C' of the exposed regions 11b may be varied according to the widths of the exposed regions 11a. In this case, the width C' of the exposed regions 11b may be about 1 to 50 μm, for example. From another standpoint, the widths (A or B) of the exposed regions may range from about two-fold to ten-fold, preferably about three-fold to five-fold of the widths (C' or C) of the exposed regions 11b, respectively.

The length D is preferably no more than 1/10 the resonator length, and a specific example is about 0.5 to 200 μm.

Figure 3A:
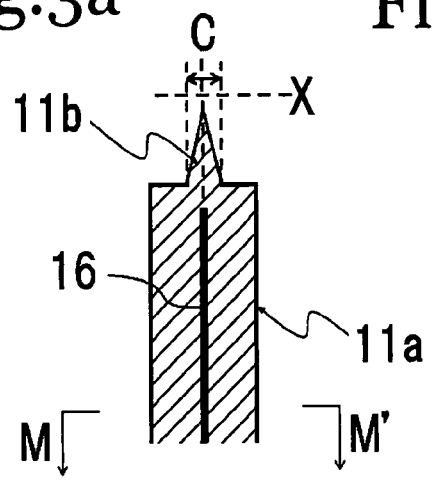
FIGS. 3a to 3c are plan views of the layout of the exposed region and protrusion regions formed by the method of the present invention for manufacturing a nitride semiconductor laser element.
Figure 3B:
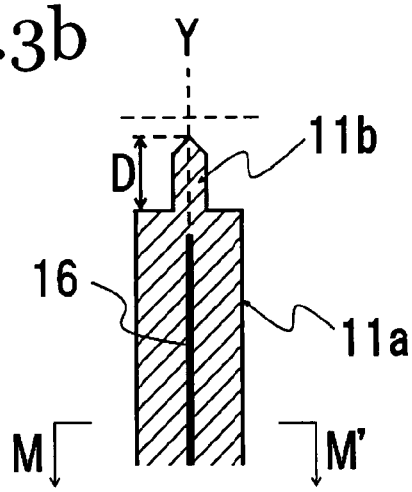
Figure 3C:
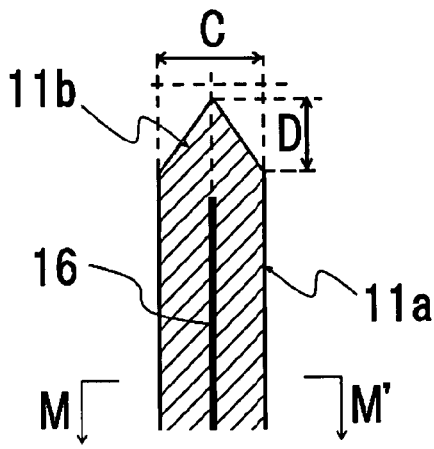

As shown in FIGS. 3a to 3c, for the protrusion regions 11b, a variety of shapes are possible, such as an isosceles triangle, a protruding shape that is pointed at the tip, or a shape that tapers to a point from the same width as the exposed region.

The slope angle of the side faces (an angle with respect to from the substrate surface) of the exposed region in the first auxiliary groove may be greater than 70°, and preferably at least 80°. In other words, the slope angle of the side faces (an angle with respect to the normal direction versus the substrate surface) of the exposed region in the first auxiliary groove may be at most 20°, and preferably at most 10°.

It came as a surprise that forming these protrusion regions 11b allowed the laser element to be divided more reliably and efficiently in the intended direction along the second auxiliary groove, along with the disposition of the second auxiliary groove (discussed below).

If a plurality of element regions is formed on the substrate, and if, for example, these are formed in a matrix or in the resonator direction, then there will also be a plurality of exposed regions 11a. In this case, the protrusion regions 11b protruding from the exposed region 11a may be disposed contiguous with the adjacent protrusion regions 11b, but are preferably disposed apart from each other. In other words, it is preferable if the ends of the first auxiliary groove (the ends of the protrusion regions) are disposed in the resulting laser element farther to the inside than the resonator end faces. This prevents the exposed region from affecting the division in a direction perpendicular or substantially perpendicular to the resonator direction for bringing out the resonator faces, allows division for obtaining resonator faces to be performed more reliably in the intended direction, and affords an even greater increase in yield. There are no particular restrictions on the separation distance E, but about ⅒ to ½ of the length D of the exposed region 11a, or more specifically about 1.0 to 20 μm, is favorable, for example.

The exposed region and the protrusion regions of the first auxiliary groove may be formed at the same time or in separate steps.

Preferably, after this or at any stage desired, the wafer is annealed in a reaction chamber in a nitrogen atmosphere and at a temperature of about 700° C. or higher so as to lower the resistance of the p-type semiconductor layer.

Also, the above-mentioned n-electrode may be formed not on the second main face of the substrate, but on the exposed region of the first conductivity type nitride semiconductor layer, either at this stage or at any subsequent stage. For example, forming the n-electrode on the exposed region is effective when the substrate is an insulating substrate.

Furthermore, a second auxiliary groove is formed within the exposed region.

The second auxiliary groove can be formed by any known method, or more specifically, by using a laser scriber (an apparatus made by Disco, an apparatus made by Laser Solution, or an apparatus made by Opto-System). This groove is preferably formed from the laminate side, that is, from the first conductivity type nitride semiconductor layer side. In forming the second auxiliary groove, it is preferable to suitably adjust the focal spot of the laser beam being used by adjusting the size of the incident laser beam, the scattering angle generated during propagation, the focal distance, and so forth, and to suitably adjust the focal depth by means of the wavelength, the focal spot size, the focal distance, and so forth. As an example, the wavelength of the laser beam being used may be about 150 to 600 μm, and the energy about 0.1 to 10 W.

Figure 3D:
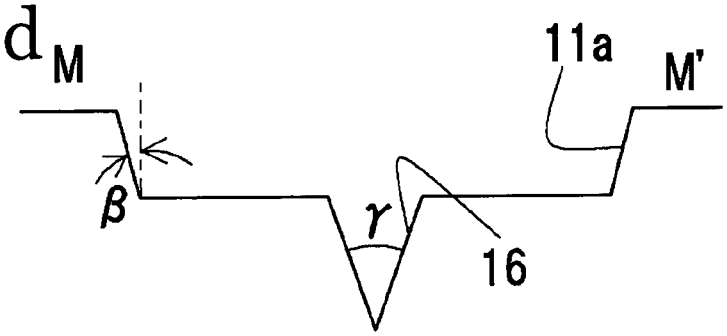
FIG. 3d and 3e are simplified cross sections of a first and a second auxiliary groove manufactured by the method of the present invention for manufacturing a nitride semiconductor laser element.
Figure 3E:
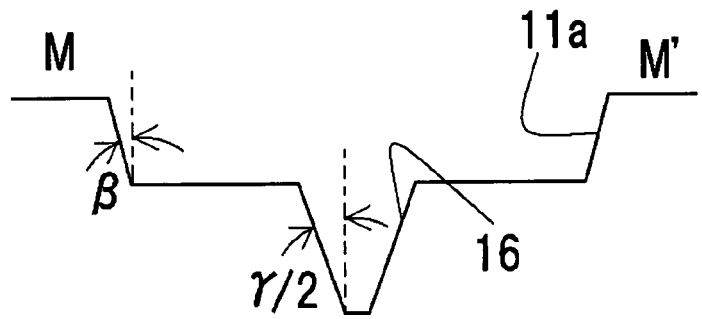
Figure 5:
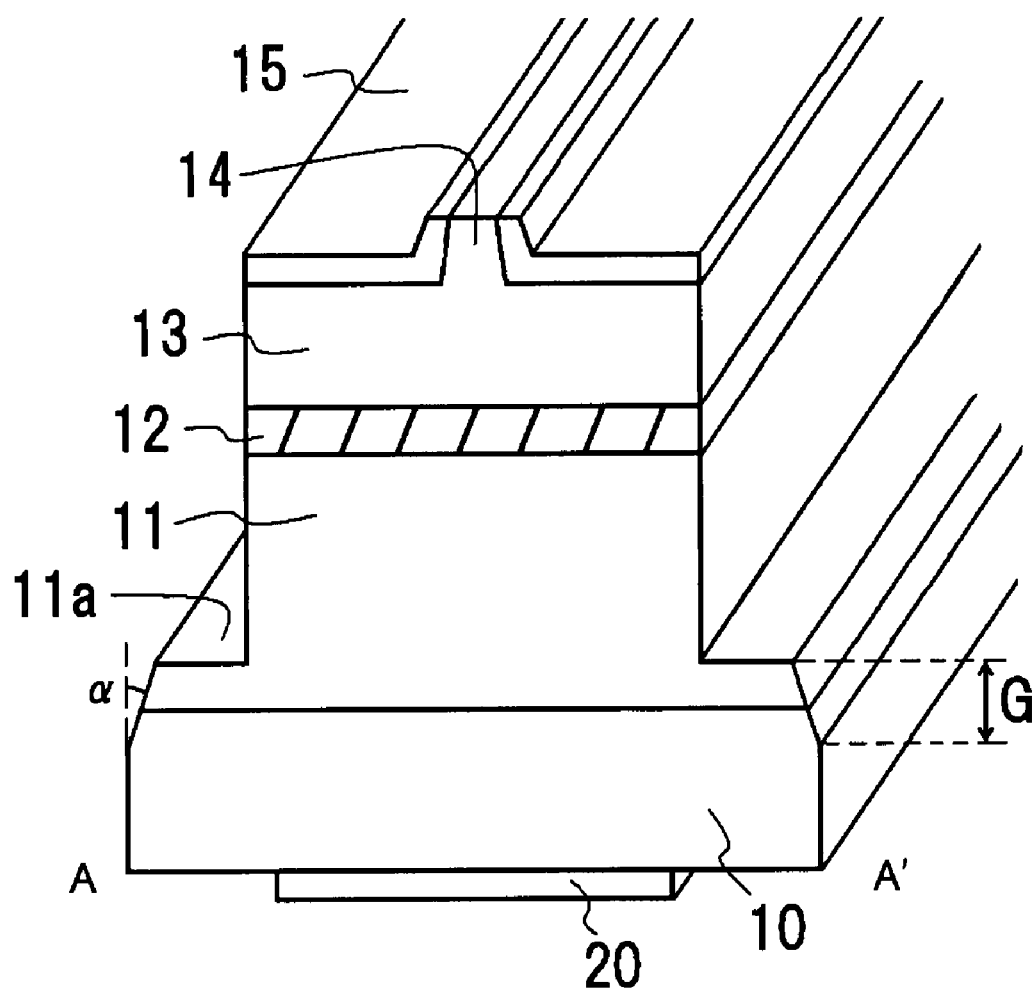
FIG. 5 is a simplified cross sectional oblique view of the laser element in FIG. 4.
Figure 6:
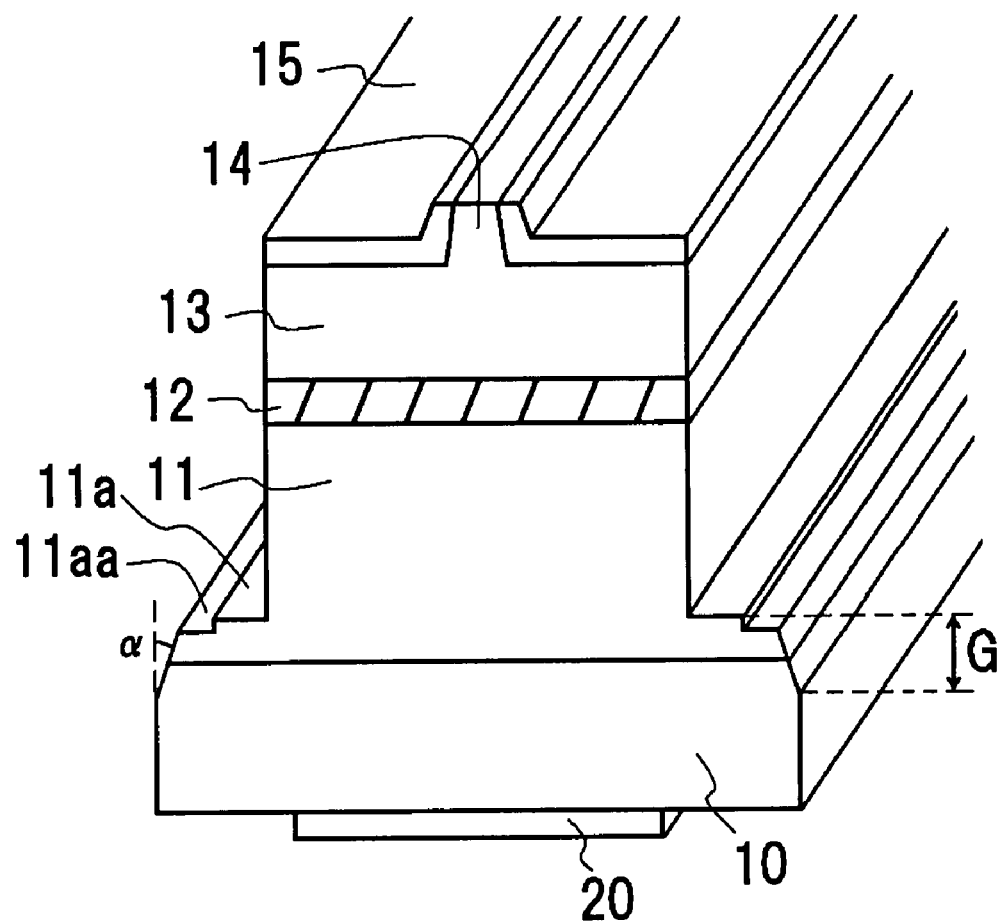
FIG. 6 is a simplified cross sectional oblique view of a laser element manufactured by the method of the present invention for manufacturing a nitride semiconductor laser element.

For example, the second auxiliary groove is preferably formed to a depth that reaches the substrate from the first conductivity type nitride semiconductor layer within the exposed region. In other words, this groove is preferably formed deeper than the first auxiliary groove. More specifically, the depth is about 15 to 30 μm, or about 20 to 25 μm, for example. Also, the second auxiliary groove is preferably formed with a greater slope angle (an angle with respect to the normal direction versus the substrate surface, see a as shown in FIGS. 5 and 6) than that of the side faces of the first auxiliary groove, that is β<α. The side faces of the first auxiliary groove are usually formed substantially perpendicular to the substrate surface, although this will vary with the method by which they are formed. In this case, the second auxiliary groove may be formed such that its side faces are about less than 90°, about not more than 60°, about 40±10°, about 20 to 55°, about 30 to 45°, about less than 30° with respect to the normal direction, but its bottom is preferably a V groove having an apex angle (γ as shown in FIG. 3d and corresponding to about 2 α) of about 100° or less, about 60° or less, about 40±10°, about 10 to 55°, about 20 to 55°, about 30 to 45°, and this V groove is preferably symmetrical around the apex at the bottom. Also, it is preferably β<γ/2. Further, the bottom of the second auxiliary groove may be flat ( as shown in FIG. 3e). In this case, its side faces may has an apex angle of the same range as the above (γ/2 as shown in FIG. 3e and corresponding to about α)

Selecting the depth and/or shape of the groove in this way ensures adequate strength during the subsequent process and prevents cracking at an unintended stage, and also allows the element to be divided easily and as intended. It is also preferable for the second auxiliary groove to be formed in a shape such that the ratio of top width to depth is about 1:1 to 1:2, about 1:1.3 to 1:1.7. There are no particular restrictions on the length of the second auxiliary groove in the resonator direction, as long as the groove is disposed within the exposed region, but the length preferably does not reach the protrusion regions. A single continuous groove does not necessarily have to be formed within the exposed region, and the groove may be divided into a plurality of parts and formed as a dotted line. This will ensure adequate substrate strength and prevent division at an unintended stage during the manufacturing process up to the intended division.

If a plurality of element regions of the laser element is formed in a matrix or in the resonator direction or a direction perpendicular to the resonator direction on the substrate (wafer), the second auxiliary groove is preferably formed over the entire substrate all at once in this step. When the second auxiliary groove is formed in this way, the groove formation portion of the entire wafer can be imaged and recognized in wafer units, so the second auxiliary groove can be formed in all of the element regions on a wafer in a single operation, and this allows a reduction in processing time, processing speed, and processing steps.

Optionally, it is preferable if washing is performed after the second auxiliary groove is formed. That is, after the second auxiliary groove has been formed, debris of the metal elements that make up the nitride semiconductor layer or the like may adhere to the surfaces inside the groove or to the surface of the exposed region near the groove, due to the energy of the laser beam. Therefore, this debris or the like is preferably washed away by a known method, such as dipping, rinsing, or ultrasonic washing using a suitable etchant, such as any of various surfactants, ammonia or another alkali, either alone or as a mixture of ammonia and hydrogen peroxide or the like, or nitride acid, hydrofluoric acid, sulfuric acid, hydrochloric acid, acetic acid, hydrogen peroxide, or another such acid, either alone or as a mixture of two or more of these. This washing allows the debris or the like to be reliably removed using an etchant, so the decrease in element characteristics that would otherwise be caused by the debris or the like can be avoided. In addition, since the resonator faces have yet to be formed at this stage, the resonator faces are not exposed to the etchant, so the debris can be effectively removed without damage to the resonator faces.

After the second auxiliary groove has been formed, optionally, it is preferable to divide the wafer into bars in order to form resonator end faces of the nitride semiconductor layer that are perpendicular to the ridge. The term resonator end faces here refers to the M plane (1-100) or the A plane (11-20). Methods for dividing the wafer into bars include blade breaking, roller breaking, and press breaking, as well as various methods, such as etching like RIE, etc.

Also, if the resonator end faces are optionally formed, a dielectric film may be preferably formed on the resonator end faces. The dielectric film is preferably formed on the light exit face and/or the light reflecting side of the resonance face. This dielectric film is a single of multilayer film composed of $SiO_2$, $ZrO_2$, $TiO_2$, $Al_2O_3$, $Nb_2O_5$, AlN, AlGaN or the like. The dielectric film can be formed with better reproducibility if the resonance face has been formed by cleavage.

After this, the second auxiliary groove is utilized to divide the substrate and laminate. This division can be accomplished by a known method. For instance, the substrate and the laminate can be cleaved and divided by applying a circular roller or blade or the like to the substrate side (that is, optionally, the opposite side from where the second auxiliary groove is formed) and thereby concentrating stress on the second auxiliary groove. The result of this is that chips that constitute one unit of a semiconductor laser element can be obtained.

The nitride semiconductor laser element of the present invention comprises a laminate on the substrate, and at least one edge of this laminate extending in the resonator direction, and preferably the edges on both sides, slope to the inside of the laser element with respect to a side face of the laminate extending in the resonator direction. From another standpoint, the nitride semiconductor laser element of the present invention comprises, on both sides in the resonator direction of the element region where the laser element is formed on the laminate surface, a first auxiliary groove having an exposed region extending in the resonator direction of the laser element and in which at least the first conductivity type nitride semiconductor layer is exposed, and two protrusion regions that are narrower than the exposed region and protrude in the resonator direction from the exposed region; and a second auxiliary groove that is disposed in the exposed region and is deeper than the first auxiliary groove.

As shown in FIG. 5, for example, the edges of this laminate are sloped such that the region of the depth G from the first nitride semiconductor layer of the laminate to the substrate, or more specifically, a depth range of less than about 30 μm from the exposed surface of the first nitride semiconductor layer (11*a* as shown in FIG. 5), and preferably a range of about 25 μm or less, has a chamfered shape. The slope angle α, for example, is preferably less than about 30° with respect to the normal direction versus the substrate surface, and about 22.5° or less is even better.

As shown in FIG. 6, for example, the portion of the laminate where the first nitride semiconductor layer is exposed may be formed in a stepped shape, and a groove corresponding to the second auxiliary groove (the portion sloped at α°) may be formed at a depth reaching the substrate. In this case, the exposed stepped portion (the lowest portion, 11*aa* as shown in FIG. 6) of the first nitride semiconductor layer may originate in the above-mentioned exposed region.

Thus sloping the edges of the laminate eliminates the bumpiness of the edges, making them smoother, with substantially all of the burrs, shavings, and so forth removed. As a result, when the side faces on the substrate side of the laminate are grasped in a subsequent manufacturing step, for example, handling is improved, and this also prevents a decrease in quality attributable to burrs, shavings, or the like, and allows a laser element of higher quality to be obtained.

Examples of the method for manufacturing a nitride semiconductor laser element, and the nitride semiconductor laser element itself, of the present invention.

EXAMPLE 1

The method for manufacturing a laser element of this Example is described below.

First, a n type GaN substrate is set into a MOCVD reaction chamber, and TMA (trimethylaluminum), TMG (trimethylgallium) and ammonia ($NH_3$) are employed, and silane gas is employed as an impurity gas to grow a first buffer layer composed of n-$Al_{0.02}Ga_{0.98}N$ doped with Si at $0.8×10^{18}/cm^3$. And then, the temperature is raised, and TMI (trimethylindium), TMG and ammonia are employed to grow a second buffer layer composed of n-$In_{0.1}Ga_{0.9}N$ doped with Si at $3×10^{18}/cm^3$.

Next, TMG and ammonia are employed to form an n-type cladding layer that is composed of $Al_{0.11}Ga_{0.89}N$ doped with Si at $1×10^{18}/cm^3$.

TMG and ammonia are used in a gas at the same temperature to grow an n-side light guide layer composed of undoped $Al_{0.06}Ga_{0.94}N$.

Next, the temperature is set to 950° C., and TMI, TMG, and ammonia are employed in a gas to grow a barrier layer composed of $Al_{0.15}Ga_{0.85}N$ doped with Si at $5×10^{18}/cm^3$. Then, the silane gas is stopped, and a undoped well layer composed of $In_{0.01}Ga_{0.99}N$ is grown. TMA is employed in a gas at the same temperature to grow a barrier layer composed of $Al_{0.15}G_{0.85}N$, thus an active layer having a single quantum well structure (SQW).

Next, TMI is stopped, and $Cp_2Mg$ is employed to grow a p-type cap layer composed of $Al_{0.30}Ga_{0.70}N$ doped with Mg at $1×10^{20}/cm^3$. $Cp_2Mg$ and TMI are stopped, and the temperature is set to 1050° C., a p-side light guide layer composed of undoped $Al_{0.06}Ga_{0.94}N$ is grown. This p-side light guide layer is undoped, but may be doped with Mg diffusion at $5×10^{16}/cm^3$ from the p-type cap layer, and may be p-type.

Next, the $Cp_2Mg$ is stopped, and TMA is employed to grow a layer composed of undoped $Al_{0.13}Ga_{0.87}N$ at temperature of 1050° C., $Cp_2Mg$ is employed to grow a layer composed of $Al_{0.09}Ga_{0.9}IN$ doped with Mg at $1×10^{19}/cm^3$, which will grow a p-type cladding layer composed of a superlattice layer having a total film thickness of 0.6 μm.

Finally, a p-type contact layer composed of GaN doped with Mg at $1×10^{20}/cm^3$ is grown on top of the p-type cladding layer.

A wafer comprising a nitride semiconductor layer laminated on a substrate was taken out of the reaction chamber, and a mask pattern composed of $SiO_2$ and consisting of a stripe with a width of 2.3 μm was formed on the surface of a p-type contact layer, which was the uppermost layer. RIE (reactive ion etching) was then used to etch close to the interface between the p-type cladding layer and the p-side light guide layer, and form a stripe-shaped ridge.

Next, a first protective film composed of a single layer of $ZrO_2$ was formed in a thickness of 100 nm using an ECR sputtering apparatus, on the surface of the nitride semiconductor layer, with the mask pattern in place. After this, the mask pattern formed on the p-type contact layer was dissolved away, and the first protective film formed on the p-type contact layer was removed along with the $SiO_2$ mask pattern by the lift-off method.

A p-side ohmic electrode was then formed as a stripe composed of nickel and gold on the outermost surface of the ridge of the p-type contact layer, and a p-side pad electrode that was electrically connected to the p-side ohmic electrode was formed over this.

Also, an n-side ohmic electrode was formed on the back of an n-type GaN substrate.

Next, a mask pattern was formed in the desired shape over the p-type contact layer, and this mask pattern was used to etch part way through the n-side light guide layer from the p-type contact layer side, and form a first auxiliary groove composed of an exposed region and protrusion regions in the n-side light guide layer. Here, as shown in FIG. 2, the length F of the exposed region 11a was set to approximately 550 μm, the width A of the wider exposed region 11a was approximately 70 μm, the width B of the narrower exposed region 11a was approximately 30 μm, the width C of the protrusion regions 11b was approximately 2 μm, the length D of the protrusion regions 11b was approximately 23 μm, and the distance E between the adjacent protrusion regions 11b was approximately 8 μm.

A V-shaped laser scribed groove 16 extending from the n-side light guide layer to the substrate was then formed as a second auxiliary groove within the exposed region 11a, at a focal distance of ±10 μm from in-focus, a feed rate of from 1 to 200 em/sec, and an output of 0.1 to 10 W. The maximum depth of the laser scribed groove in this case was approximately 25 μm, and the width of the n-side light guide layer surface was approximately 15 μm. The apex angle was approximately 40°.

After this, an acid solution was used to ultrasonically wash the interior and surface of the laser scribed groove, and remove any debris or the like adhering thereto.

Figure 4A:
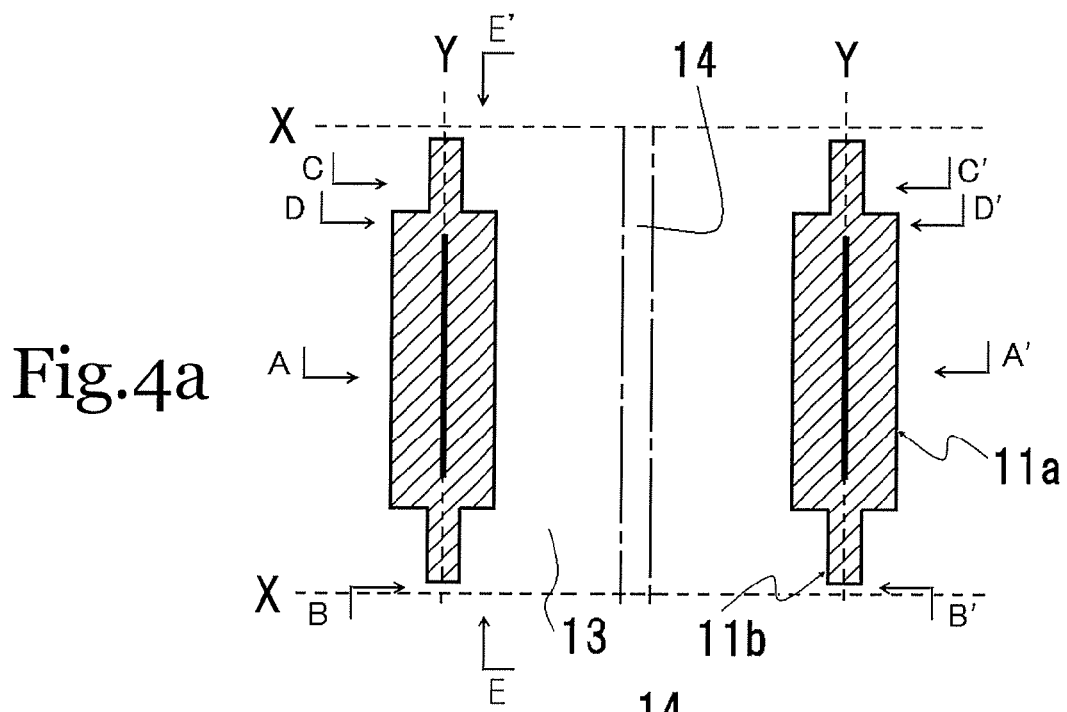
FIG. 4a is a simplified plan view of a laser element, and FIGS. 4b to 4f consist of simplified cross sections of a laser element manufactured by the method of the present invention for manufacturing a nitride semiconductor laser element.

The wafer was then divided into bars by cleaving the GaN along the dotted lines X in FIG. 4a, for example, at the M plane of the GaN substrate (when the nitride semiconductor is expressed as a hexagonal prism, this plane corresponds to the side faces of this hexagonal prism), and resonator faces were produced at the cleavage planes of these bars.

A dielectric film was formed on the resonator faces. On the front side, an $Al_2O_3$ film was formed in a thickness of 120 nm. On the rear side, a laminated film of $ZrO_2$ and $SiO_2$ (total thickness of 700 nm) was used to form a multilayer dielectric film. After this, chips were produced by diving the bar-shaped wafers along laser scribed grooves that had been formed previously, in a direction perpendicular to the resonator face (such as along the dotted line Y in FIG. 4a).

Figure 4B:
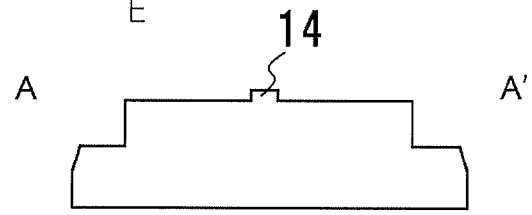
Figure 4C:
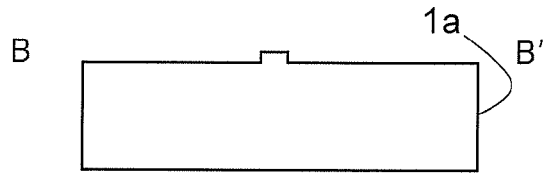
Figure 4D:
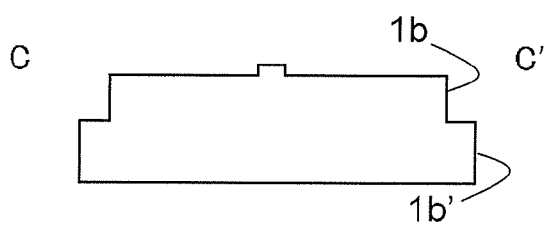
Figure 4E:
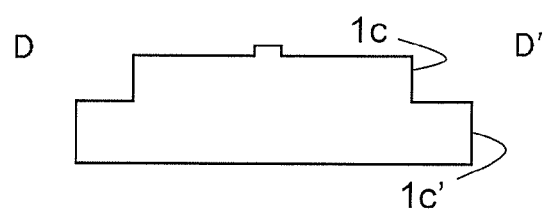
Figure 4F:
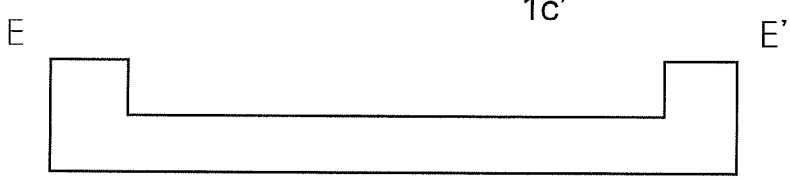

As shown in FIGS. 4b to 4f and FIG. 5, the semiconductor laser element thus obtained comprised a substrate 10 over which were laminated an n-type semiconductor layer 11, an active layer 12, and a p-type semiconductor layer 13 with a ridge 14 formed on its surface, and a first protective film 15 was formed on both sides of the ridge 14. More specifically, FIG. 4b shows a simplified cross sectional view of a portion of a single semiconductor laser element as taken along a section line A-A' in FIG. 4a, FIG. 4c shows a simplified cross sectional view of the semiconductor laser element in an end section as taken along a section line B-B' in FIG. 4a, FIG. 4d shows a simplified cross sectional view of the semiconductor laser element in a second section as taken along a section line C-C' in FIG. 4a, FIG. 4e shows a simplified cross sectional view of the semiconductor laser element in a first section as taken along a section line D-D' in FIG. 4a, and FIG. 4f is a simplified cross sectional view of the semiconductor laser element as taken along a section line E-E'. As shown in FIG. 4c, the outer side face of the semiconductor laser element has the end section disposed adjacent to the resonator end face with the end section being a substantially flat surface 1a. As shown in FIG. 4e, the outer side face of the semiconductor laser element has the first section disposed between the sloped edge (formed by the groove 16) and the resonator end face, and the first section has a first upper side face 1c and a first lower side face 1 c' that are substantially parallel to the normal direction to the substrate. As shown in FIG. 4d, the outer side face of the semiconductor laser element further has the second section disposed between the first section and the resonator end face, and the second section has a second upper side face 1b and a second lower side face 1b' that are substantially parallel to the normal direction to the substrate. The second upper side face 1b is disposed outwardly of the first upper side surface 1c, and the second lower side face 1b' is flush with the first lower side face 1c'. Also formed were a p-electrode (not shown) that was electrically connected to the ridge 14, and an n-electrode 20 that was electrically connected to the substrate 10.

A chamfer with a depth G of approximately 25 μm was formed on the edges of the laminate of this semiconductor laser element, sloped to the inside of the element at α=20 with respect to the side faces of the substrate 10 and the first conductivity type nitride semiconductor layer on the substrate side.

These sloped faces were smooth, with no bumpiness, and no burrs or the like adhered whatsoever.

The defect ratio when semiconductor laser elements such as this were formed by the same method was calculated and found to be 12.0%.

For the sake of comparison, semiconductor laser chips were produced by the same method as above, except that no protrusion regions were formed in the first auxiliary groove, and the defect ratio was calculated in the same way and found to be 22.0%.

Thus, with the present invention, providing protrusion regions in the division of a wafer featuring a laser scribed groove allows the wafer to be reliably broken in the intended direction, and affords a higher yield in the manufacture of laser elements of consistent quality. In particular, when the protrusion regions are not formed contiguously, there will be no unintended cracking or the like of the wafer caused by the first auxiliary groove and the second auxiliary groove, even in the production resonator faces along the dotted lines X in FIG. 4a, for example, and the yield can be increased in the manufacture of a nitride semiconductor laser element lot.

Also, debris and the like can be reliably washed away without damaging the resonator end faces, so good characteristics can be maintained.

Furthermore, by utilizing laser scribing, the portions to be laser scribed can be recognized and machined in wafer units, so machining takes less time and running costs can be reduced, and since there is no need to replace consumable parts as in a scribing method that entails physical contact, manufacturing cost can be further lowered.

Also, any uneven bumpiness, burrs, or the like at the edges of the element can be effectively removed.

Furthermore, it is possible to avoid the causes of cracking that would otherwise occur, for example, when the laminate is grasped in a later process due to the adhesion of burrs or shavings, and to avoid problems such as short circuiting caused by the adhesion of shavings, and to provide a laser element of high quality.

EXAMPLE 2

Semiconductor laser chips were produced by substantially the same method as in Example 1, except that the distance E separating the protrusion regions was eliminated, and the protrusion regions were formed such that adjacent protrusion regions were contiguous.

The defect ratio when semiconductor laser elements such as this were formed by the same method was calculated and found to be 6.3%.

Thus, with the present invention, providing protrusion regions in the division of a wafer featuring a laser scribed groove allows the wafer to be reliably broken in the intended direction, and affords a higher yield in the manufacture of laser elements of consistent quality, obtained in Example 2 had about the same characteristics as those in Example 1.

EXAMPLE 3

Semiconductor laser chips were produced by substantially the same method as in Example 1, except that the distance E separating the protrusion regions was eliminated, the protrusion regions were formed such that adjacent protrusion regions were contiguous, and the width C of the protrusion regions was changed to approximately 8 μm.

The defect ratio when semiconductor laser elements such as this were formed by the same method was calculated and found to be 7.0%.

Thus, with the present invention, providing protrusion regions in the division of a wafer featuring a laser scribed groove allows the wafer to be reliably broken in the intended direction, and affords a higher yield in the manufacture of laser elements of consistent quality, obtained in Example 3 had about the same characteristics as those in Example 1.

EXAMPLE 4

Semiconductor laser chips were produced by substantially the same method as in Example 1, except that, as shown in FIG. 7, the width A of the wider exposed region 11a was approximately 30 μm, the width C' of the protrusion regions 11b was approximately 10 μm, the width B of the narrower exposed region 11a was approximately 10 μm, the width C of the protrusion regions 11b was approximately 3.

The defect ratio when semiconductor laser elements such as this were formed by the same method was calculated and found to be similar to Example 1.

Thus, with the present invention, providing protrusion regions in the division of a wafer featuring a laser scribed groove allows the wafer to be reliably broken in the intended direction, and affords a higher yield in the manufacture of laser elements of consistent quality, obtained in Example 4 had about the same characteristics as those in Example 1.

This application claims priority to Japanese Patent Application Nos. 2006-132477 and 2007-113635. The entire disclosure of Japanese Patent Application Nos. 2006-132477 and 2007-113635 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claim is:

1. A method for manufacturing a nitride semiconductor laser element, equipped with a laminate that has a first conductivity type nitride semiconductor layer, an active layer, and a second conductivity type nitride semiconductor layer on a substrate, and constitutes a resonator, comprising the steps of:
   forming a first auxiliary groove having an exposed region extending in the resonator direction of the laser element and in which at least the second conductivity type nitride semiconductor layer and the active layer are removed from the second conductivity type nitride semiconductor layer side on both sides in the resonator direction of an element region where the laser element is formed on the surface of the laminate, thereby exposing the first conductivity type nitride semiconductor layer, and two protrusion regions that are narrower than the exposed region and protrude in the resonator direction from the exposed region;
   forming a second auxiliary groove whose slope angle of the side faces with respect to the normal direction versus the substrate surface is greater than that of the first auxiliary groove within the exposed region; and
   dividing the substrate and the laminate with using the second auxiliary groove.

2. The method according to claim 1, wherein a plurality of element regions and a plurality of exposed regions are formed in at least the resonator direction, and adjacent first auxiliary grooves are disposed apart from each other.

3. The method according to claim 1, wherein a plurality of element regions and a plurality of exposed regions are formed in at least a direction perpendicular to the resonator direction, and are disposed such that the width of the exposed regions varies in an alternating pattern.

4. The method according to claim 1, wherein a plurality of element regions and a plurality of exposed regions are formed in a matrix.

5. The method according to claim 4, wherein a resonator end face is formed by separating the substrate and the laminate in a direction perpendicular to the resonator direction after the second auxiliary groove is formed.

6. The method according to claim 5, wherein a dielectric film is further formed on a resonator end face.

7. The method according to claim 1, wherein an end face of the first auxiliary groove is disposed more to the inside than a resonator end face.

8. The method according to claim 1, wherein the substrate and the laminate are divided with using the second auxiliary groove after a dielectric film is formed on a resonator end face.

9. The method according to claim 1, wherein the second auxiliary groove is formed at a depth that reaches the substrate from the first conductivity type nitride semiconductor layer.

10. The method according to claim 1, wherein the second auxiliary groove is formed as a V-groove with an angle of less than 60° at its bottom.

11. The method according to claim 1, wherein the second auxiliary groove is formed such that the ratio of tap surface width to depth is from 1:1 to 1:2.

12. The method according to claim 1, wherein the second auxiliary groove is formed by laser scribe.

13. A nitride semiconductor laser element nitride semiconductor laser element equipped with a laminate that has a first conductivity type nitride semiconductor layer, an active layer, and a second conductivity type nitride semiconductor layer on a substrate and constitutes a resonator,
   wherein an outer side face of the laminate extending in the resonator direction has an edge that slopes to the inside of the laser element with respect to the normal direction to the substrate so that a portion of the edge away from the substrate is disposed inwardly of a portion of the edge close to the substrate, and wherein the slope of the edge is less than 30°.

14. The nitride semiconductor laser element according to claim 13, wherein the slope of the edge is within a depth range of less than 30 μm from an exposed surface of the first conductivity type nitride semiconductor layer.

15. A nitride semiconductor laser element equipped with a laminate that has a first conductivity type nitride semiconductor layer, an active layer, and a second conductivity type nitride semiconductor layer on a substrate, and constitutes a resonator, comprising:

on both sides in the resonator direction of an element region where a laser element is formed on the surface of the laminate, a first auxiliary groove having an exposed region extending in the resonator direction of the laser element and in which at least the first conductivity type nitride semiconductor layer is exposed, and two protrusion regions that are narrower than the exposed region and protrude in the resonator direction from the exposed region; and a second auxiliary groove that is disposed in the exposed region and is deeper than the first auxiliary groove.

16. The nitride semiconductor laser element according to claim 15, wherein the second auxiliary groove has side faces whose slope angle thereof with respect to the normal direction versus the substrate surface is greater than that of the first auxiliary groove.

17. A nitride semiconductor laser element equipped with a laminate that has a first conductivity type nitride semiconductor layer, an active layer, and a second conductivity type nitride semiconductor layer on a substrate and constitutes a resonator, wherein an outer side face of the laminate extending in the resonator direction has an edge that slopes to the inside of the laser element with respect to the normal direction to the substrate so that a portion of the edge away from the substrate is disposed inwardly of a portion of the edge close to the substrate, and wherein the outer side face of the laminate has a first section disposed between the edge and a resonator end face with the resonator end face extending substantially perpendicular to the outer side face, the first section including a first upper side face and a first lower side face that are substantially parallel to the normal direction to the substrate, the first section being substantially free of a sloped surface with respect to the normal direction to the substrate.

18. The nitride semiconductor laser element according to claim 17, wherein the outer side face of the laminate has a second section disposed between the first section and the resonator end face, the second section including a second upper side face and a second lower side face that are substantially parallel to the normal direction to the substrate, the second upper side face being disposed outwardly of the first upper side surface, the second lower side face being flush with the first lower side face, and the second section being substantially free of a sloped surface with respect to the normal direction to the substrate.

19. The nitride semiconductor laser element according to claim 1, wherein the outer side face of the laminate has an end section disposed adjacent to a resonator end face with the resonator end face extending substantially perpendicular to the outer side face, the end section being a substantially flat surface that is parallel to the normal direction to the substrate.

20. The nitride semiconductor laser element according to claim 18, wherein the outer side face of the laminate has an end section disposed between the second section and the resonator end face, the end section being a substantially flat surface that is parallel to the normal direction to the substrate.

21. The nitride semiconductor laser element according to claim 17, wherein the slope of the edge is within a depth range of less than 30 μm from an exposed surface of the first conductivity type nitride semiconductor layer.

* * * * *